US009655287B1

(12) United States Patent
Babcock et al.

(10) Patent No.: US 9,655,287 B1
(45) Date of Patent: May 16, 2017

(54) HEAT EXCHANGERS FOR COOLING INTEGRATED CIRCUITS

(71) Applicant: International Business Machines Corporation, Armonk, NY (US)

(72) Inventors: Raymond F. Babcock, Stewartville, MN (US); Matthew A. Butterbaugh, Rochester, MN (US); Eric A. Eckberg, Rochester, MN (US); Gerhard I. Meijer, Zurich (CH); David R. Motschman, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/014,101

(22) Filed: Feb. 3, 2016

(51) Int. Cl.
*H05K 7/20* (2006.01)
*H05K 1/02* (2006.01)
(Continued)

(52) U.S. Cl.
CPC ......... *H05K 7/20809* (2013.01); *F28D 15/00* (2013.01); *F28F 3/06* (2013.01);
(Continued)

(58) Field of Classification Search
CPC .. H05K 7/20809; H05K 1/0203; F28D 15/00; F28D 2021/0031; F28F 3/06; F28F 9/262; F28F 3/12; F28F 2250/08
(Continued)

(56) References Cited

U.S. PATENT DOCUMENTS

| 4,448,028 | A | 5/1984 | Chao et al. |
| 6,830,098 | B1 * | 12/2004 | Todd ................... F28D 15/0275 165/104.21 |

(Continued)

FOREIGN PATENT DOCUMENTS

| CN | 2042943 U | 8/1989 |
| CN | 104101235 A | 10/2014 |

(Continued)

OTHER PUBLICATIONS

Unknown, "Commercial Solid Rivets," Hanson Rivet & Supply Co. Inc., Printed on Oct. 6, 2015, 3 pages, copyright © 2014 Hanson Rivet http://www.hansonrivet.com/commercial-solid-rivets.htm.
(Continued)

*Primary Examiner* — Anthony Haughton
*Assistant Examiner* — Yahya Ahmad
(74) *Attorney, Agent, or Firm* — Nicholas D. Bowman

(57) ABSTRACT

A heat exchanger includes a flat metal tube that has flat top and bottom surfaces and an inner passage. The surfaces remove heat from a liquid passing through the passage from an inlet and toward an outlet of the heat exchanger. A first plurality of solid metal posts are mounted perpendicularly upon the top surface. Each fin of a first plurality of fins has holes fitted about the first plurality of posts such that the fins are mounted on the posts in vertically-spaced, parallel alignment relative to each other and the top surface. A second plurality of solid metal posts are mounted perpendicularly upon the bottom surface. Each fin of a second plurality of fins has holes fitted about the second plurality of posts such that the fins are mounted on the posts in vertically-spaced, parallel alignment relative to each other and the bottom surface.

17 Claims, 9 Drawing Sheets

(51) Int. Cl.
*F28D 15/00* (2006.01)
*F28F 3/06* (2006.01)
*F28F 3/12* (2006.01)
*F28F 9/26* (2006.01)
*F28D 21/00* (2006.01)

(52) U.S. Cl.
CPC .............. *F28F 3/12* (2013.01); *F28F 9/262* (2013.01); *H05K 1/0203* (2013.01); *F28D 2021/0031* (2013.01); *F28F 2250/08* (2013.01)

(58) Field of Classification Search
USPC ................... 361/679.52–679.54, 698–716
See application file for complete search history.

(56) References Cited

U.S. PATENT DOCUMENTS

| | | | |
|---|---|---|---|
| 8,995,132 B2 | 3/2015 | Kataoka et al. | |
| 2004/0012927 A1 | 1/2004 | Lee et al. | |
| 2006/0196052 A1* | 9/2006 | Lesage | B21D 53/085 29/890.043 |
| 2008/0028788 A1* | 2/2008 | Higashiyama | F25B 39/02 62/515 |
| 2008/0158828 A1 | 7/2008 | Chen | |
| 2009/0159241 A1* | 6/2009 | Lipp | F28D 1/05316 165/80.2 |
| 2011/0146952 A1* | 6/2011 | Beldring | F28D 9/0012 165/104.13 |
| 2011/0155351 A1* | 6/2011 | Li | F28D 15/0275 165/104.26 |
| 2011/0265976 A1* | 11/2011 | Li | H01L 23/3672 165/104.26 |
| 2013/0105128 A1* | 5/2013 | Vanderwees | F28D 9/005 165/165 |
| 2013/0126136 A1* | 5/2013 | Hwang | F28F 9/262 165/144 |
| 2013/0153183 A1 | 6/2013 | Velan | |
| 2015/0159958 A1 | 6/2015 | Kimura | |
| 2016/0082555 A1* | 3/2016 | Nishimura | F28F 1/325 62/498 |
| 2016/0097597 A1* | 4/2016 | Ishizaka | F25B 39/02 62/525 |

FOREIGN PATENT DOCUMENTS

| | | |
|---|---|---|
| CN | 204461156 U | 7/2015 |
| GB | 1014855 A | 12/1965 |
| JP | 2005121297 A | 5/2005 |
| KR | 101003377 B1 | 12/2010 |
| WO | 2013042879 A3 | 3/2013 |

OTHER PUBLICATIONS

Babcock et al., "Air-Cooled Heatsink for Cooling Integrated Circuits", U.S. Appl. No. 15/014,114, filed Feb. 3, 2016.

List of IBM Patents or Patent Applications Treated as Related, Dated Jan. 29, 2016, 2 pages.

Tech Parts Warehouse, "Dell P4 CPU Heatsink Assembly Xeon Nocona Prescott SMT/TMD", TPW Part: DE-W4254 | Mfg. Part: W4254, Printed on Jan. 29, 2016, 2 pages, Copyright 2012 TechPartsWarehouse.com.

* cited by examiner

HEAT EXCHANGERS FOR COOLING INTEGRATED CIRCUITS

BACKGROUND

The present disclosure relates generally to the field of computer system cooling, and in particular to heat exchangers for cooling integrated circuits.

While operating within a computer system, integrated circuits may generate excess heat. Left unchecked, this excess heat may increase the operating temperatures of the integrated circuits to deleterious levels and thereby cause premature failure or suboptimal performance of the computer system. To mitigate these problems, a variety of thermally dissipative systems may be used to remove this unwanted heat from the integrated circuits that generate it.

SUMMARY

According to embodiments, aspects of the present disclosure include system. The system includes a heat exchanger. The heat exchanger includes a flat metal tube. The flat metal tube has a flat top surface, a flat bottom surface, and an inner passage. The top and bottom surfaces are configured to remove waste heat from a liquid as the liquid passes through the passage from an inlet and toward an outlet of the heat exchanger. A first plurality of thermally-conductive solid metal posts are mounted perpendicularly upon the top surface. Each fin of a first plurality of fins has a first plurality of holes fitted about the first plurality of posts such that the first plurality of fins are mounted on the first plurality of posts in vertically-spaced, parallel alignment relative to each other and the top surface. A second plurality of thermally-conductive solid metal posts are mounted perpendicularly upon the bottom surface. Each fin of a second plurality of fins has a second plurality of holes fitted about the second plurality of posts such that the second plurality of fins are mounted on the second plurality of posts in vertically-spaced, parallel alignment relative to each other and the bottom surface.

According to further embodiments, aspects of the present disclosure include a method. As part of the method, a liquid is pumped through a heat exchanger. The heat exchanger includes a flat metal tube. The flat metal tube has a flat top surface, a flat bottom surface, and an inner passage. The top and bottom surfaces are configured to remove waste heat from the liquid as the liquid passes through the passage from an inlet and toward an outlet of the heat exchanger. A first plurality of thermally-conductive solid metal posts are mounted perpendicularly upon the top surface. Each fin of the first plurality of fins has a first plurality of holes fitted about the first plurality of posts such that the first plurality of fins are mounted on the first plurality of posts in vertically-spaced, parallel alignment relative to each other and the top surface. A second plurality of thermally-conductive solid metal posts are mounted perpendicularly upon the bottom surface. Each fin of a second plurality of fins has a second plurality of holes fitted about the second plurality of posts such that the second plurality of fins are mounted on the second plurality of posts in vertically-spaced, parallel alignment relative to each other and the bottom surface.

According to further embodiments, aspects of the present disclosure include system. The system includes a heat exchanger. The heat exchanger includes a first section attached to an inlet of the heat exchanger. The first section includes a first flat metal tube having a first flat top surface, a first flat bottom surface, and a first inner passage. The first section also includes a first upper plurality of solid metal posts mounted perpendicularly upon the first top surface. The first section also includes a first lower plurality of solid metal posts mounted perpendicularly upon the first bottom surface. The heat exchanger also includes a second section attached to an outlet of the heat exchanger. The second section includes a second flat metal tube having a second flat top surface, a second flat bottom surface, and a second inner passage. The second section also includes a second upper plurality of solid metal posts mounted perpendicularly upon the second top surface. The second section also includes a second lower plurality of solid metal posts mounted perpendicularly upon the second bottom surface. The heat exchanger also includes an upper plurality of flat metal fins. Each fin of the upper plurality of fins is mounted on the first upper plurality of posts and the second upper plurality of posts such that the upper plurality of fins are in vertically-spaced, parallel alignment relative to each other, the first top surface, and the second top surface. The heat exchanger also includes a lower plurality of flat metal fins. Each fin of the lower plurality of fins is mounted on the first lower plurality of posts and the second lower plurality of posts such that the lower plurality of fins are in vertically-spaced, parallel alignment relative to each other, the first bottom surface, and the second bottom surface. The heat exchanger is configured to allow a liquid to pass from the inlet heat exchanger and toward the outlet of the heat exchanger via the first inner passage and the second inner passage in series.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

Figure 1A:
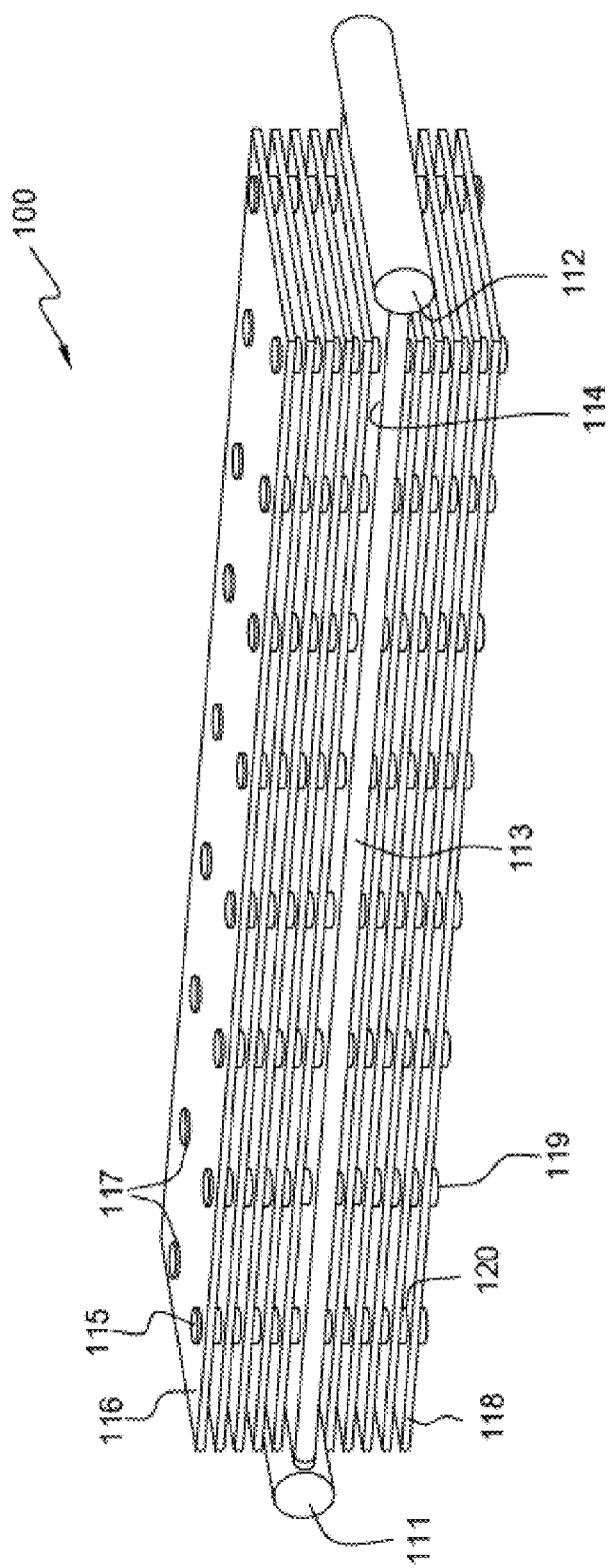
FIG. 1A illustrates an isometric view of a liquid-to-air heat exchanger, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Aspects of the present disclosure relate generally to the field of computer system cooling, and in particular to heat exchangers for cooling integrated circuits. While the present disclosure is not necessarily limited to such applications, various aspects of the disclosure may be appreciated through a discussion of various examples using this context.

As used herein, a "set" may refer generally to one or more of the item to which it relates.

As used herein, a "computer system" may refer generally to any computer or server. Computer systems may include, without limitation, web servers, application servers, mail servers, virtual servers, supercomputers, and high performance computing systems.

As used herein, an "integrated circuit" may refer generally to a set of electronic circuits on a semiconductor plate that together provide computational capabilities for a computer system. Integrated circuits may include, without limitation, microprocessors such as central processing units (CPUs) or graphics processor units (GPUs).

When attempting to cool integrated circuits, a variety of thermally dissipative system may be used. One commonly used cooling device is a heat pipe. In some situations, heat pipes are mounted on a metal slug that is thermally coupled to an integrated circuit. Heat from the integrated circuit is transferred through the slug and into the heat pipes. Fluid within each heat pipe is then cycled along the height of the heat pipe through an evaporation/condensation cycle that causes the heat to dissipate. In general, heat pipes may be effective at removing waste heat; however, they may not be usable in small spaces. Specifically, heat pipes may not be effective in server environments that are one rack unit (44.45 mm) or less in height. This may be due, at least in part, to three common sources of effective height loss for heat pipes. First, a heat pipe is usually manually crimped at the top of its height. This crimp zone is usually about one to two pipe diameters, which for a typical 3 mm diameter heat pipe, would be about 3-6 mm. A second common loss in effective height occurs due to the slug at the bottom of the heat pipe. This slug is usually about 3 mm thick. Third, there is usually a bend diameter of about 6 mm from where the heat pipe bottom connects to the slug and begins to curve upwardly to where the heat pipe is vertical. A sharper bend (e.g., a bend radius smaller than 6 mm) may damage a wick material in the heat pipe because the wick material tends to be brittle. Combining these three height losses means that a typical heat pipe will have between 12 mm and 15 mm of height that cannot effectively be used to contact air-cooled fins that remove heat from the heat pipe. In a one rack unit or less environment, this loss of height may mean that the heat pipe performance is significantly reduced.

Another cooling device that may be used for cooling an integrated circuit is a pin fin array. A typical pin fin array includes a base that is thermally coupled to an integrated circuit and a high concentration of pin fins that extend upwardly from the base. In use, heat is transferred from the integrated circuit, through the base of the array, and upwardly along the heights of the pin fins. Air passing over the array then removes the heat from the pin fins and draws the heat away from the array. One problem that may be associated with pin fin arrays is a large air pressure drop across an array. Specifically, the high concentration of pin fins may cause significant air resistance (e.g., impedance) to air flowing around the pin fins.

Yet another cooling device that may be used for integrated circuit cooling is traditional heat sink that includes several parallel flat fins that are mounted perpendicularly on a base surface that is thermally coupled to an integrated circuit. When this heat sink is used, heat is transferred up through the base and into the parallel fins. Air then flows through channels formed between neighboring fins and convects (e.g., draws) the heat away from the fins. These heat sinks may be acceptable under circumstances where air tends to flow across the heat sink in only one direction. In situations where the air flows in different patterns that have different directions across the heat sink, the effectiveness of such a design may be significantly reduced. Specifically, if the air flows in a direction perpendicular to the fins, then the air will not flow through the perpendicular fins, and the heatsink effectiveness will be thereby eliminated and high air flow impedance will be added for the entire system.

In some embodiments of the present disclosure, an integrated circuit may be cooled using a heat exchanger that is both configured to receive air flow from multiple directions without significant changes in air resistance and configured to be usable in small spaces, such as one rack unit or less environments.

Figure 1B:
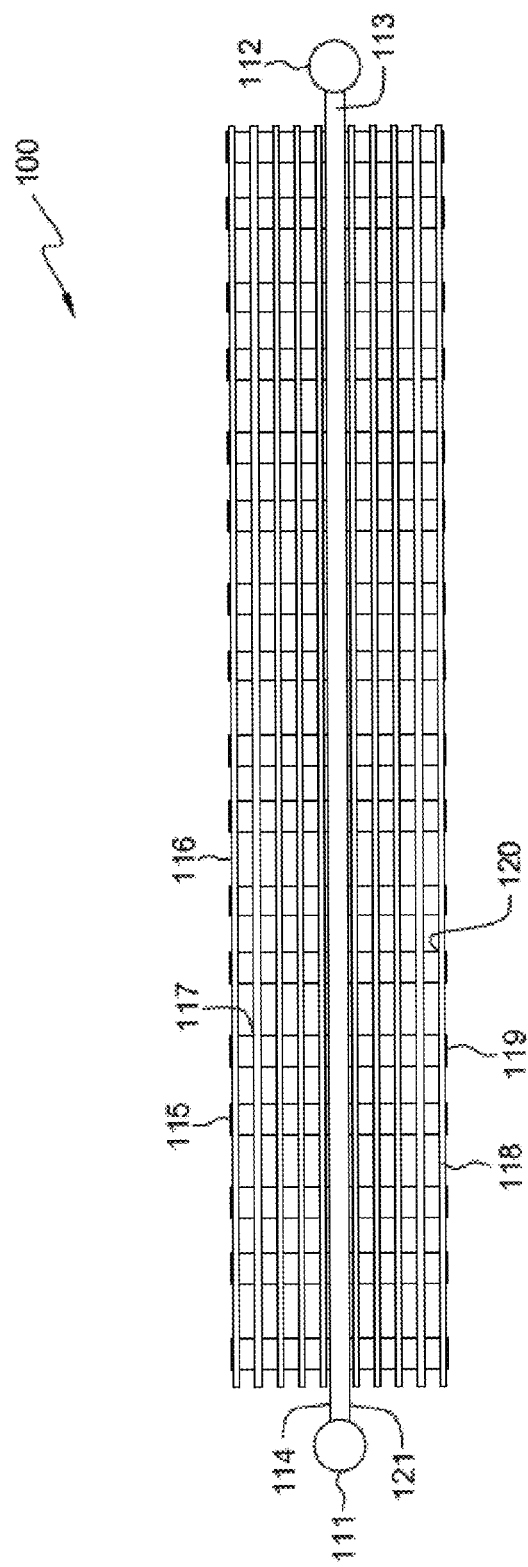
FIG. 1B illustrates a side view of the liquid-to-air heat exchanger shown in FIG. 1A, in accordance with embodiments of the present disclosure.
Figure 1C:
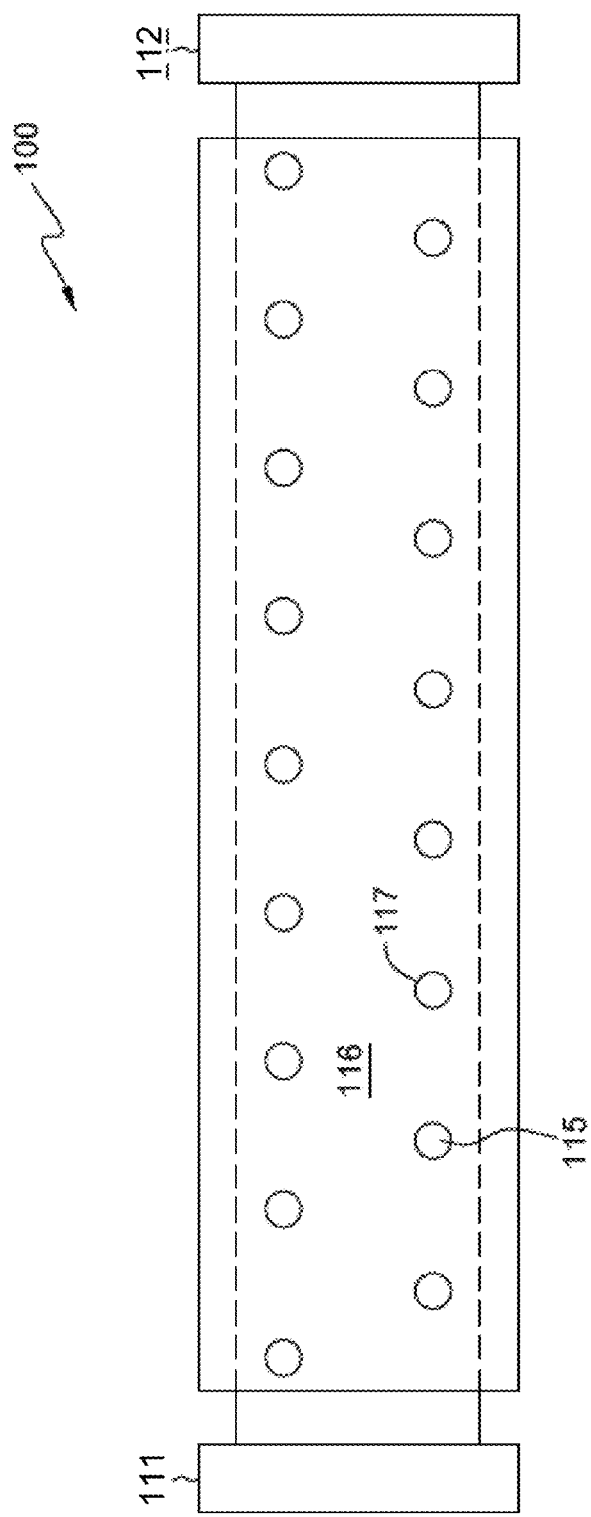
FIG. 1C illustrates an overhead view of the liquid-to-air heat exchanger shown in FIGS. 1A and 1B, in accordance with embodiments of the present disclosure.

Referring now to FIGS. 1A-1C, shown are three different views of a liquid-to-air heat exchanger 100, in accordance with embodiments of the present disclosure. In some embodiments, the liquid-to-air heat exchanger 100 may be used in a closed cooling loop (such as the cooling loop described below in reference to FIG. 4) for cooling an integrated circuit within a computer system (e.g., a server). As shown in the isometric view (FIG. 1A), the side view (FIG. 1B), and/or the overhead view (FIG. 1C), the liquid-to-air heat exchanger 100 includes a flat metal tube 113 extending from the heat exchanger inlet 111 to the heat exchanger outlet 112. In some embodiments, the flat metal tube 113 may be less than 2 mm thick. In some embodiments, the heat exchanger inlet 111 comprises a cylindrical metal tube that is configured to receive heated liquid to be cooled within the heat exchanger 100. Likewise, the heat exchanger outlet 112 comprises a second cylindrical metal tube that is configured to output the liquid after the liquid is cooled within the heat exchanger 100.

A top surface 114 of the metal tube 113 serves as a base for an upper portion of the heat exchanger 100. Mounted perpendicularly upon this top surface 114 is a first (upper) plurality of thermally-conductive solid (e.g., non-hollow) metal posts 115. In some embodiments, the posts 115 may be soldered onto the top surface 114. Mounted upon these posts 115 is a first (upper) plurality of flat metal fins 116. These fins 116 each have a first plurality of holes (e.g., slot) 117 that are fitted about the lengths of the posts 115. As depicted, each fin 116 includes a hole 117 corresponding to each post 115 such that the number of holes 117 in each fin 116 equals the number of posts 115. As mounted, the fins 116 are in vertically-spaced, parallel alignment relative to each other and the top surface 114.

Similarly to the top surface 114, a bottom surface 121 of the metal tube 113 serves as a base for a lower portion of the heat exchanger 100. Mounted perpendicularly upon this bottom surface 121 is a second (lower) plurality of thermally-conductive solid metal posts 119. In some embodiments, the posts 119 may be soldered onto the bottom surface 114. Mounted upon these posts 119 is a second (lower) plurality of flat metal fins 118. These fins 118 each have a second plurality of holes 120 that are fitted about the lengths of the posts 119. As depicted, each fin 118 includes a hole 120 corresponding to each post 119 such that the number of holes 120 in each fin 118 equals the number of posts 119. As mounted, the fins 118 are in vertically-spaced, parallel alignment relative to each other and the bottom surface 121.

When the heat exchanger 100 is in use, a liquid (e.g., water) containing waste heat is pumped through it. Specifically, the liquid is received at the inlet 111 and passes through an inner passage within the flat metal tube 113 toward (and eventually through) the outlet 112. While passing through the flat metal tube 113, the liquid transfers the waste heat to the tube's top surface 114 and bottom surface 121.

In the upper portion of the heat exchanger 100, upon removing (e.g., obtaining and/or drawing away) the waste heat from the liquid, the top surface 114 transfers the heat to bases of the upper posts 115. The heat is then transferred upwardly along the lengths of the upper posts 115. From these posts 115, the heat is transferred outwardly across the flat surfaces of the upper fins 116. Air passing between the upper fins 116 then removes the heat from the flat surfaces of the fins 116 and draws the heat away from the heat exchanger 100.

The lower portion of the heat exchanger 100 may operate in a similar manner. Specifically, the bottom surface 121 of flat metal tube 113 removes the waste heat from the liquid and transfers the heat to bases of the lower posts 119. The heat is then transferred downwardly along the lengths of the lower posts 119 and outwardly across the flat surfaces of the lower fins 118. Air passing between the lower fins 118 then removes the heat and draws it away from the heat exchanger 100. In some embodiments, the heat exchanger 100 may have certain advantages over comparable heat exchangers that do not have the lower portion described herein. Specifically, the addition of the lower portion may increase the proportion of the surface area of the metal tube 113 that conducts heat outwardly for dissipation by air flow. For example, without the lower portion air may flow above the top surface 114 of the metal tube 113 but not below the bottom surface of the metal tube.

In some embodiments, the heat exchanger 100 may be configured such that resistance to air flow passing between the fins (both the upper fins 116 and the lower fins 118) is substantially the same for multiple directions of air flow. For example, in one embodiment, if the air flow through the heat exchanger 100 were to change from a first direction parallel to the surfaces of the fins to a second direction that is also parallel to the surfaces of the fins but is perpendicular to the first direction, this new air flow path would be allowed by the heat exchanger 100, whereas the air flow would be blocked by a traditional heatsink. In some embodiments, the air flow resistance caused by the heat exchanger 100 remains substantially the same, as long as the air flows parallel to the fins, regardless of the direction of the air flow.

In some embodiments, the heat exchanger 100 may be configured to be used in small spaces within a computer environment. For example, in some embodiments, the entire heat exchanger 100 may be configured to be less than two rack units (88.90 mm) in height. In some embodiments, the heat exchanger may be configured to be less than one rack unit (44.45 mm) in height. Specifically, in some embodiments, the vertical distance between the top-most points on the upper posts 115 and the bottom-most points on the lower posts 119 may be less than 88.90 mm or less than 44.45 mm.

Figure 2:
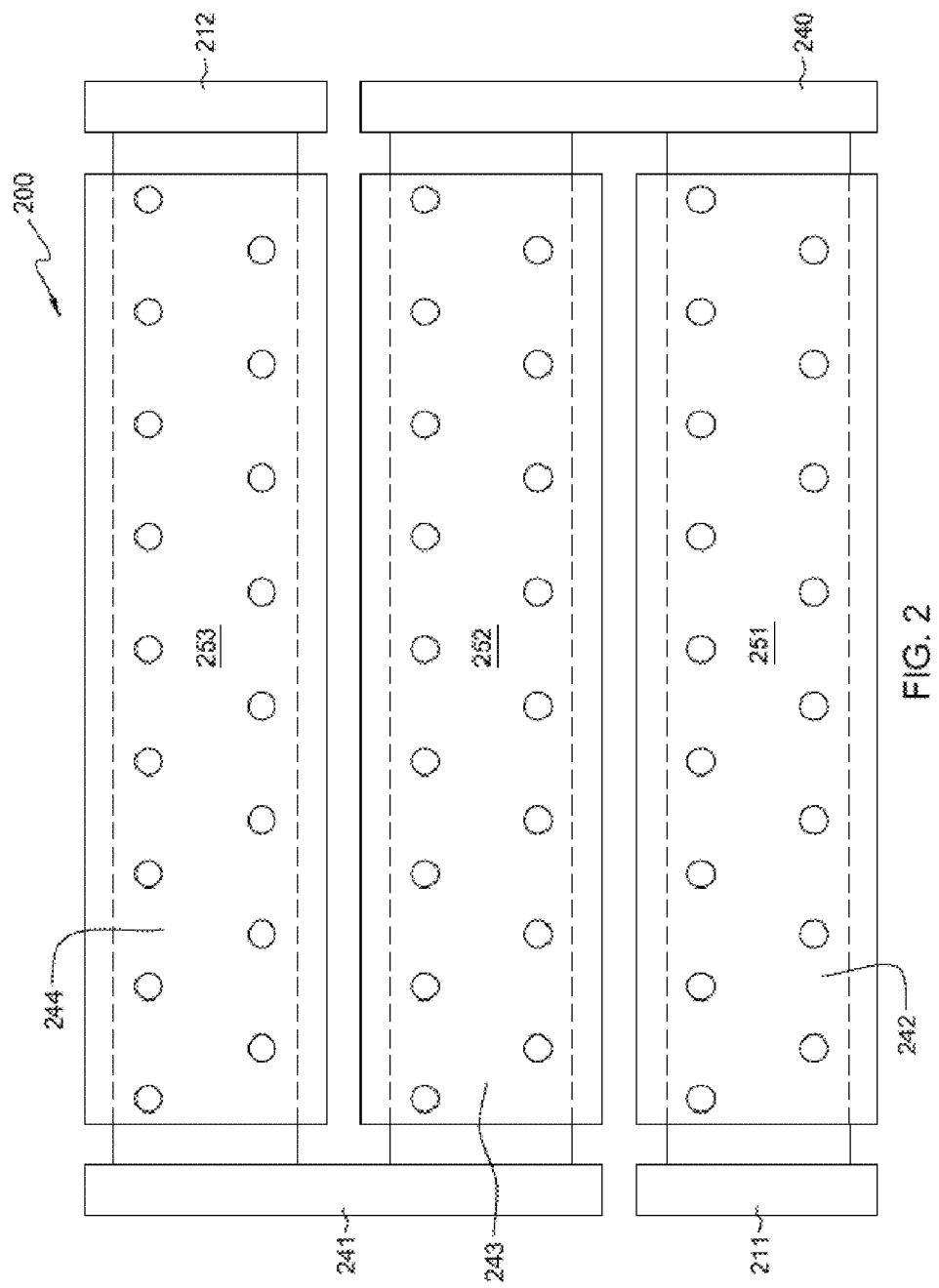
FIG. 2 illustrates an overhead view of a multi-sectional liquid-to-air heat exchanger, in accordance with embodiments of the present disclosure.

Referring now to FIG. 2, shown is an overhead view of a multi-sectional liquid-to-air heat exchanger 200, in accordance with embodiments of the present disclosure. As depicted, the multi-sectional heat exchanger 200 includes three sections 242, 243, and 244. In some embodiments, any number of sections greater than one may be included in a multi-sectional heat exchanger 200. Furthermore, in some embodiments, a first section 242 and third (last) section 244 may be connected by one or more intermediate sections (e.g., second section 243) disposed between them.

In some embodiments, each section 242-244 may be substantially similar to the heat exchanger 100, described in reference to FIG. 1, with a few modifications to allow liquid to be pumped through each of the sections in series. As depicted, a first section 242 of the multi-sectional heat exchanger 200 is configured to receive the fluid in an inlet tube 211 and then allow the liquid to pass through its inner passage to first linker tube 240. The first linker tube 240, connected to the first section 242 opposite the inlet tube 211, is configured to link the first section 242 to the second section 243 such that the fluid exiting the first section 242 passes through the first linker tube 240 and into an inner passage within the second section 243. A second linker tube 241, connected to the second section 243 opposite the first linker tube 240, is configured to obtain the fluid exiting the second section 243 and pass the liquid through itself and into an inner passage within a third section 244. Upon exiting the third section 244, the liquid passes out of the multi-section heat exchanger 200 via an outlet tube 212. In some embodiments, the liquid passes through adjacent sections in opposite directions. For example, the liquid may pass through the first section 242 in a first direction, pass through the second section 243 in a second direction opposite the first direction, and then pass through the third section 244 in the first direction again. Furthermore, in some embodiments, the linker tubes 240 and 241 may not be included in the heat exchanger 200. In such embodiments, the inner passages within the sections 242-244 may directly connected to each other at or near their ends.

As depicted, the fins of the sections 242-244, are separated from each other by gaps that allow air flow between the sections 242-244. For example, the upper-most fin 251 of the first section 242 is separated from the upper-most fin 252 of the second section 243 by a first gap, and upper-most fin 253 of the third section 244 is separated from the opposite edge of the upper-most fin 252 of the second section 243 by a second gap. In other embodiments, however, the fins may span across all of the sections 242-244. For example, in such an embodiment, the upper-most fins 251-253 may exist together as a single integral fin.

Figure 3A:
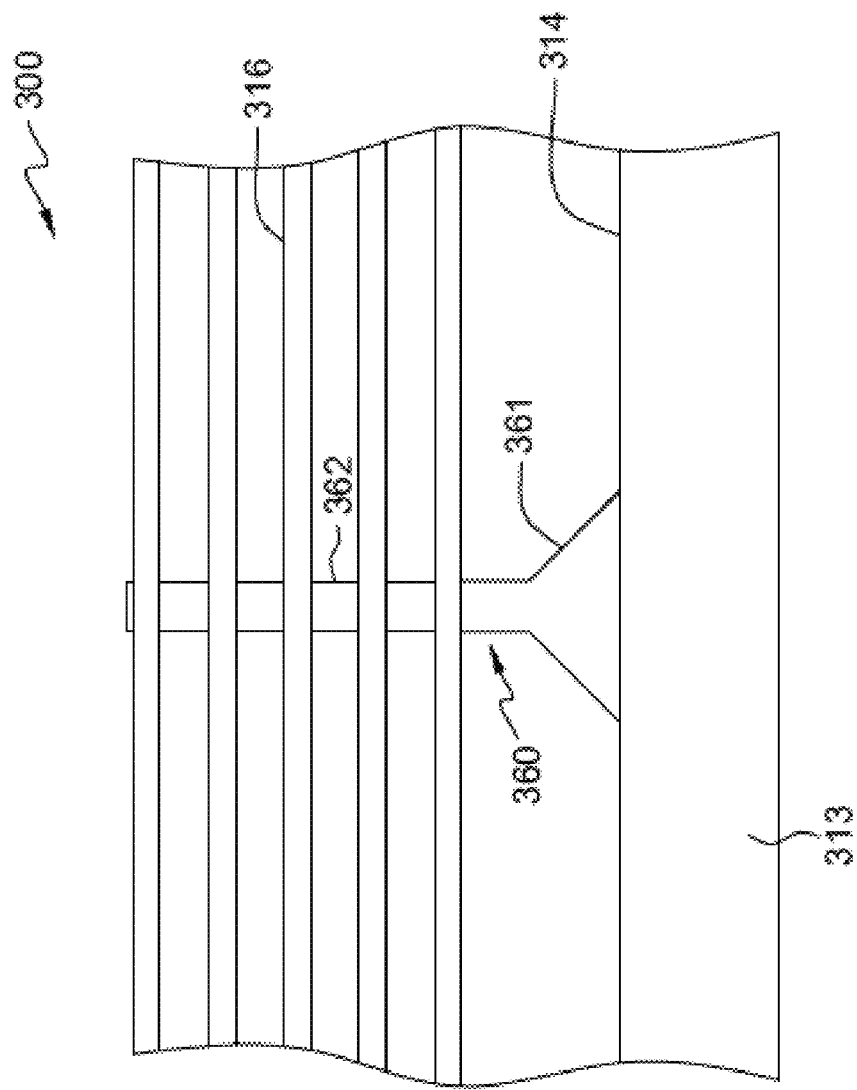
FIG. 3A illustrates a side view of a conically-based solid metal post mounted in a heat exchanger, in accordance with embodiments of the present disclosure.

Referring now to FIG. 3A, shown is a side view of a conically-based solid metal post 360 mounted in a heat exchanger 300, in accordance with embodiments of the present disclosure. In some embodiments the heat exchanger 300, only a small portion of which is shown in FIG. 3A, may be substantially similar to the heat exchanger 100 described in reference to FIGS. 1A-1C. Specifically, as depicted, the heat exchanger 300 includes a flat metal tube 313 upon which an upper plurality of solid metal posts (of which only one post, 360, is shown). An upper plurality of fins 316 are mounted on the post 360.

As depicted, the post 360 includes a conical (i.e., conically-shaped) base portion 361 and cylindrical length portion 362 that extends upwardly from the top of the base portion 361. A bottom, circular surface of the base portion 361, which is mounted on a top surface 314 of the metal tube 313, has a diameter x that is greater than the width y of the length portion 362, upon which the fins 316 are mounted. In some embodiments, x is at least twenty-five percent greater than y. In some embodiments, the post 360 may be a commercially-available flathead rivet.

In some embodiments, the shape of the post 360 may offer certain advantages over a similar cylindrical post that has a constant width from bottom to top. Specifically, a wider base portion 361 may allow for faster, more efficient heat transfer from the top surface 314 of the metal tube 313 to the post 360 because of the relatively large surface area of the bottom of base portion 361. Also, the narrower length portion 362 may allow for less resistance to air flow between the fins 316 because the relatively small side surface area of the length portion blocks less of the air flow.

Figure 3B:
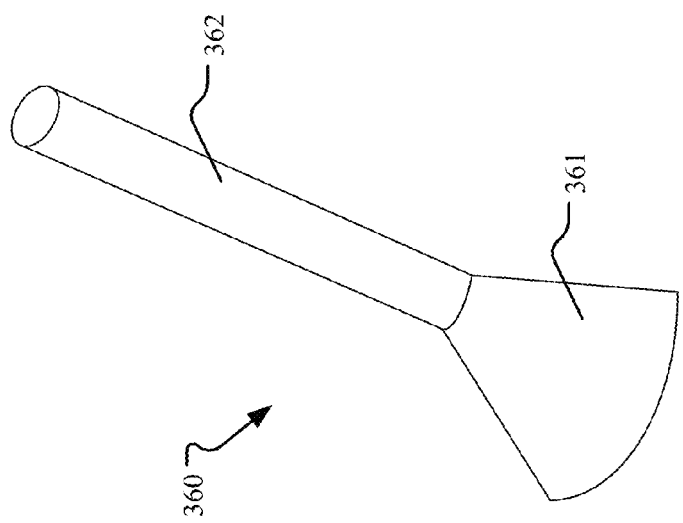
FIG. 3B illustrates an isometric view of the conically-based post shown in FIG. 3A in isolation, in accordance with embodiments of the present disclosure.

FIG. 3B shows an isometric view of the conically-based post 360 shown in FIG. 3A in isolation, in accordance with embodiments of the present disclosure.

Figure 4A:
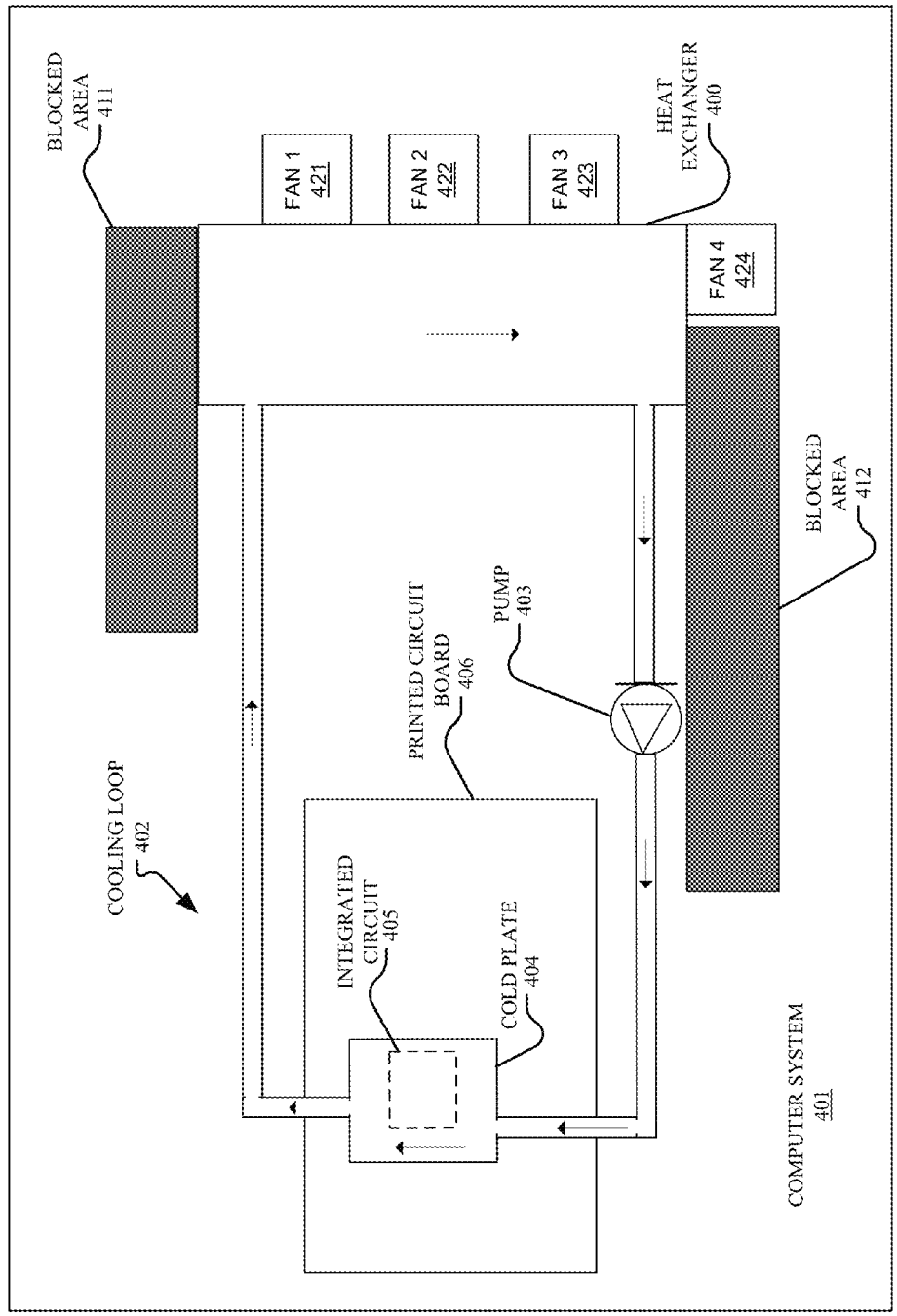
FIG. 4A illustrates a schematic diagram of a mechanically-pumped cooling loop located within a computer system and configured for using a liquid-to-air heat exchanger, a cold plate, and a set of fans in combination to cool an integrated circuit, in accordance with embodiments of the present disclosure.

Referring now to FIG. 4A, shown is a schematic diagram of a mechanically-pumped cooling loop 402 located within a computer system 401 and configured for using a liquid-to-air heat exchanger 400, a cold plate 404, and a set of fans 421-424 in combination to cool an integrated circuit 405, in accordance with embodiments of the present disclosure. In the depicted example, the arrows within the cooling loop 402 represent the direction of flow of a liquid as it circulates through the cooling loop 402.

An example iteration of the liquid completing a revolution within the loop 402 is described. To begin the iteration, the liquid is output from an outlet of a heater exchanger 400 in a cooled state into a first set of tubing linking the output of the heat exchanger to an input of a cold plate. In some embodiments, the heat exchanger 400 is substantially the same as the heat exchanger 100 described in reference to FIG. 1. The cooled liquid next passes through a pump 403 that is configured to maintain/adjust the flow rate of the liquid as it circulates within the loop 402. In some embodiments, more than one mechanical pump may be utilized at various locations within the loop 402.

Continuing through the loop 402, the cooled liquid then passes into a cold plate 404. The cold plate 404 is configured to remove operational (waste) heat from an integrated circuit 405 to which the cold plate 404 is thermally coupled. Specifically, in the depicted example, the cold plate 404 is connected, via a thermal interface material, to the integrated circuit 405, which is itself mounted on a printed circuit board 406. As the liquid passes through the cold plate 404 the operational heat from the integrated circuit 405 is transferred into the liquid, causing the liquid to become heated as its temperature rises. In some embodiments, there may be many different possible configurations for the cold plate 404. For example, in some embodiments, the cold plate 404 includes a series of winding tube sections through which the liquid passes as it is heated.

After passing through an output of the cold plate 404, the now-heated liquid passes through a second set of tubing (e.g., metal tubing material) into an inlet of the heat exchanger 400. The heated liquid is cooled within the heat exchanger 400 by transferring its waste heat into the top and bottom surfaces of the metal tube (not shown) through which the liquid passes within the heat exchanger 400. The liquid is then output, to begin a new loop iteration, as a cooled liquid once again.

Figure 4B:
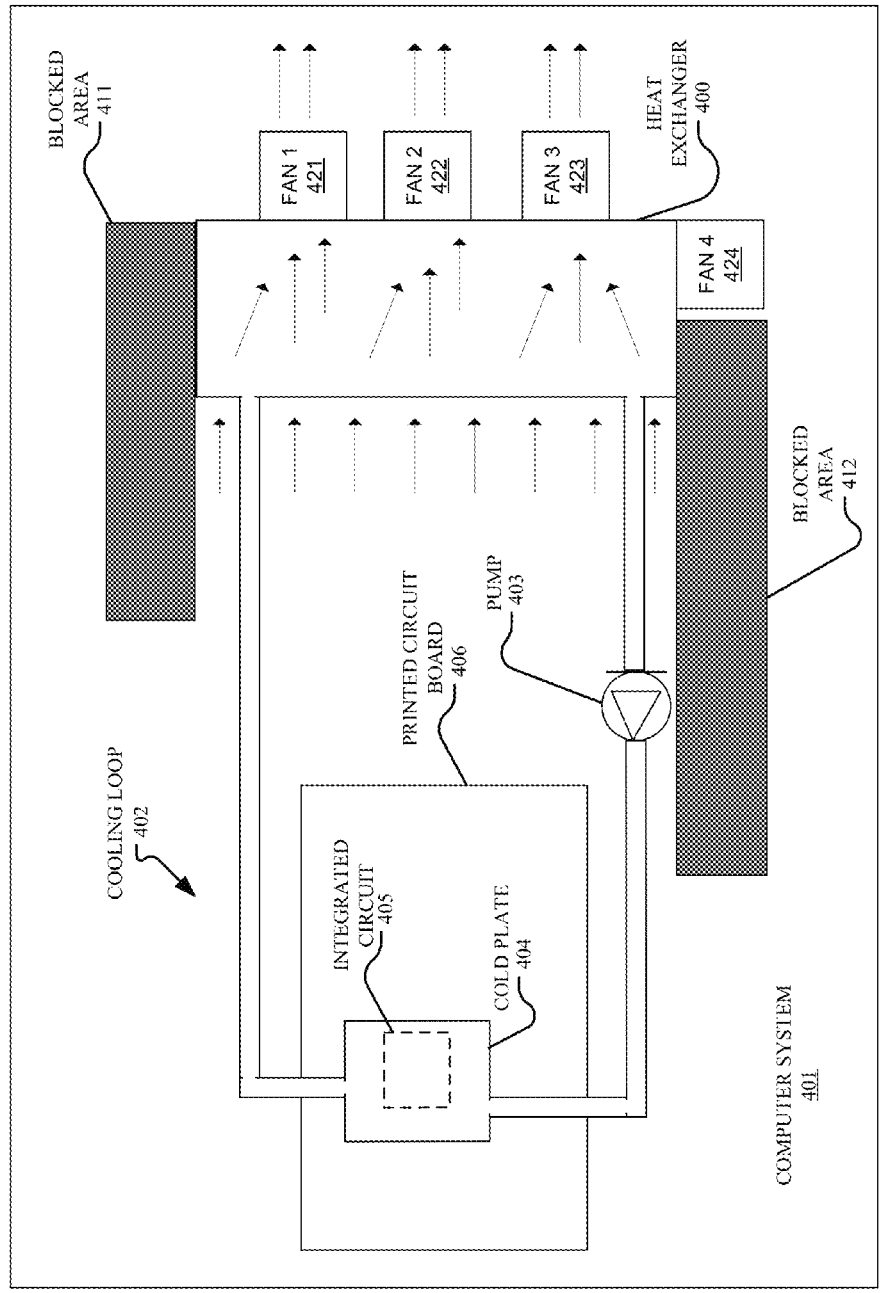
FIG. 4B illustrates a first air flow pattern through the heat exchanger shown in FIG. 4A that occurs when a first set of fans are used to draw the air through the heat exchanger, in accordance with embodiments of the present disclosure.

Referring now to FIG. 4B, shown is a first air flow pattern through the heat exchanger 400 shown in FIG. 4A that occurs when a first set of fans 421-423 are used to draw the air through the heat exchanger 400, in accordance with embodiments of the present disclosure. In the depicted example, the first set of fans (including fan 421, fan 422, and fan 423) are turned on and being used to draw air between the fins (not shown) of heat exchanger 400. The direction of air flow is represented by arrows. In this example, a fourth fan, fan 424, is turned off. As shown, the first set of fans 421-423 draw the air across the heat exchanger, through their respective inlets, and out of their respective exhausts. The blocked areas 411 and 412 represent areas within the computer system 401 wherein the air cannot flow, for example, because of mechanical obstructions.

Figure 4C:
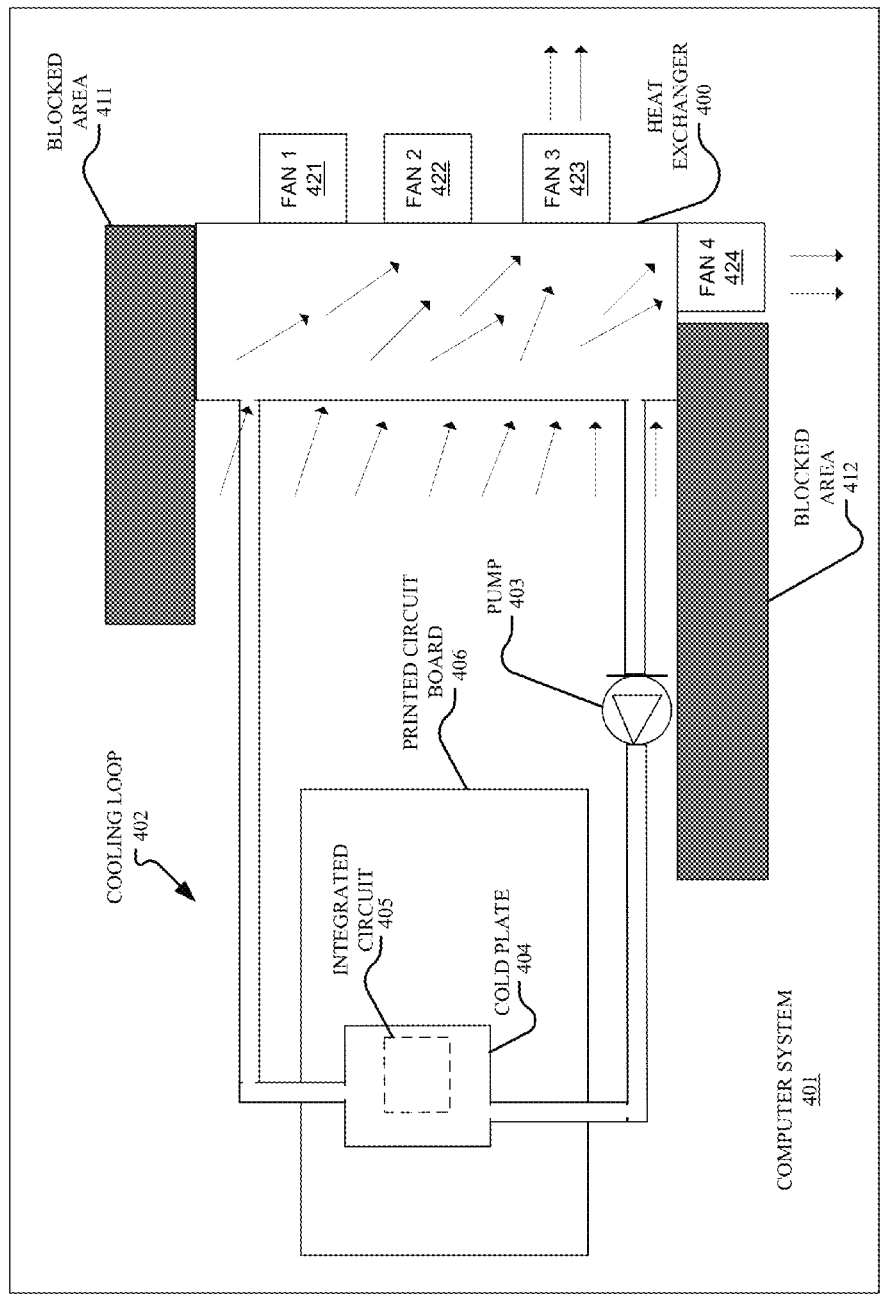
FIG. 4C illustrates a second air flow pattern through the heat exchanger shown in FIGS. 4A and 4B that occurs when a second set of fans are used to draw the air through the heat exchanger, in accordance with embodiments of the present disclosure.

Referring now to FIG. 4C, shown is a second air flow pattern through the heat exchanger 400 shown in FIGS. 4A and 4B that occurs when a second set of fans 423-424 are used to draw the air through the heat exchanger 400, in accordance with embodiments of the present disclosure. In this second depicted example, a second set of fans (including fan 423 and fan 424) are turned on and being used to draw the air between the fins (not shown) of heat exchanger 400. The new direction of air flow is represented by arrows. In this second example, the fans 421 and 422 are turned off, and the second set of fans 423 and 424 draw the air across the heat exchanger, through their respective inlets, and out of their respective exhausts.

As can be seen by comparing FIGS. 4B and 4C, the differences in which of the fans 421-424 are used may have a substantial impact on the direction of air flow across the heat exchanger 400. In some embodiments, a multitude of other air flow patterns may occur depending on which of the fans 421-424 are being used at any given time and the fan speed of each of the fans that are being used. A potential cause of one or more fans 421-424 not being used is fan failure. Thus, in some embodiments, the heat exchanger 400 may be less susceptible to negative impact of fan failure than a comparable heat exchanger that does not easily adjust to changes in air flow patterns.

While an example embodiment of a computer system 401 is depicted in FIGS. 4A-4C, it should be understood that, in some embodiments, many other variants of the computer system 401 are possible. For example, in some embodiments, the devices within the computer system 401 (e.g., pump 403 and fans 421-424) may be rearranged within the computer system in any suitable arrangement or may not be used at all and other devices may be included. For example, in some embodiments, the computer system 401 may not include any fans or its fans may be located upstream of the printed circuit board 406.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the foregoing detailed description of exemplary embodiments of the various embodiments, reference was made to the accompanying drawings (where like numbers represent like elements), which form a part hereof, and in which is shown by way of illustration specific exemplary embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the foregoing description, numerous specific details were set forth to provide a thorough understanding the various embodiments. But, the various embodiments may be practiced without these specific details. In other instances, well-known circuits, structures, and techniques have not been shown in detail in order not to obscure embodiments.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

What is claimed is:

1. A system comprising a heat exchanger, wherein the heat exchanger comprises:
   a flat metal tube having a flat top surface, a flat bottom surface, and an inner passage, the top and bottom surfaces configured to remove waste heat from a liquid as the liquid passes through the passage from an inlet and toward an outlet of the heat exchanger;
   a first plurality of thermally-conductive solid metal posts mounted perpendicularly upon the top surface;
   a first plurality of flat metal fins, each fin of the first plurality of fins having a first plurality of holes fitted about the first plurality of posts such that the first plurality of fins are mounted on the first plurality of posts in vertically-spaced, parallel alignment relative to each other and the top surface;
   a second plurality of thermally-conductive solid metal posts mounted perpendicularly upon the bottom surface; and
   a second plurality of flat metal fins, each fin of the second plurality of fins having a second plurality of holes fitted about the second plurality of posts such that the second plurality of fins are mounted on the second plurality of posts in vertically-spaced, parallel alignment relative to each other and the bottom surface.

2. The system of claim 1,
   wherein bases of the first plurality of posts are configured to remove the waste heat from the top surface and are further configured to transfer the waste heat upwardly along the first plurality of posts,
   wherein the first plurality of fins are configured to remove the waste heat from the first plurality of posts and are further configured to spread the waste heat outwardly across flat surfaces of the first plurality of fins such that air passing between the first plurality of fins removes the waste heat from the flat surfaces of the first plurality of fins and transfers the waste heat away from the heat exchanger,
   wherein bases of the second plurality of posts are configured to remove the waste heat from the bottom surface and are further configured to transfer the waste heat downwardly along the second plurality of posts, and
   wherein the second plurality of fins are configured to remove the waste heat from the second plurality of posts and are further configured to spread the waste heat outwardly across flat surfaces of the second plurality of fins such that air passing between the second plurality of fins removes the waste heat from the flat surfaces of the second plurality of fins and transfers the waste heat away from the heat exchanger.

3. The system of claim 1, wherein the heat exchanger is configured to allow flow of air passing between the first plurality of fins in a first direction to substantially a same extent as air passing between the first plurality of fins in a second direction, wherein the first and second directions are parallel to the flat surfaces of the first plurality of fins and perpendicular to each other.

4. The system of claim 1 further comprising:
   an integrated circuit mounted on a printed circuit board;
   a cold plate attached to the integrated circuit, the cold plate configured such that as the liquid passes from an inlet of the cold plate and toward an output of the cold plate, the liquid removes the waste heat from the integrated circuit, wherein the waste heat is operational heat generated by the integrated circuit;
   a first set of tubing disposed between the outlet of the heat exchanger and the inlet of the cold plate, the first set of tubing configured to allow the liquid to pass from the heat exchanger and toward the cold plate; and
   a second set of tubing disposed between the outlet of the cold plate and the inlet of the heat exchanger, the second set of tubing configured to allow the liquid to pass from the cold plate and toward the heat exchanger.

5. The system of claim 1 further comprising:
   a set of fans configured to force air to pass between the first plurality of fins such that the air removes the waste heat from the flat surfaces of the first plurality of fins and transfers the waste heat away from the heat exchanger.

6. The system of claim 1, wherein a height of the heat exchanger is less than 44.45 mm.

7. The system of claim 1, wherein a thickness of the flat metal tube less than 2 mm.

8. The system of claim 1, wherein each post of the first plurality of posts comprises a conically-shaped base portion having a bottom surface mounted on the top surface of the metal tube and a cylindrical length portion upon which the first plurality of fins are mounted.

9. A method comprising:
pumping a liquid through a heat exchanger, wherein the heat exchanger comprises:
a flat metal tube having a flat top surface, a flat bottom surface, and an inner passage, the top and bottom surfaces configured to remove waste heat from the liquid as the liquid passes through the passage from an inlet and toward an outlet of the heat exchanger;
a first plurality of thermally-conductive solid metal posts mounted perpendicularly upon the top surface;
a first plurality of flat metal fins, each fin of the first plurality of fins having a first plurality of holes fitted about the first plurality of posts such that the first plurality of fins are mounted on the first plurality of posts in vertically-spaced, parallel alignment relative to each other and the top surface;
a second plurality of thermally-conductive solid metal posts mounted perpendicularly upon the bottom surface; and
a second plurality of flat metal fins, each fin of the second plurality of fins having a second plurality of holes fitted about the second plurality of posts such that the second plurality of fins are mounted on the second plurality of posts in vertically-spaced, parallel alignment relative to each other and the bottom surface.

10. The method of claim 9, wherein the heat exchanger is configured to allow flow of air passing between the first plurality of fins in a first direction to substantially a same extent as air passing between the first plurality of fins in a second direction, wherein the first and second directions are parallel to the flat surfaces of the first plurality of fins and perpendicular to each other.

11. The method of claim 9 further comprising:
pumping the liquid through a cold plate attached to an integrated circuit mounted on a printed circuit board, the cold plate configured such that as the liquid passes from an inlet of the cold plate and toward an output of the cold plate, the liquid removes the waste heat from the integrated circuit, wherein the waste heat is operational heat generated by the integrated circuit;
pumping the liquid through a first set of tubing disposed between the outlet of the heat exchanger and the inlet of the cold plate, the first set of tubing configured to allow the liquid to pass from the heat exchanger and toward the cold plate; and
pumping the liquid through a second set of tubing disposed between the outlet of the cold plate and the inlet of the heat exchanger, the second set of tubing configured to allow the liquid to pass from the cold plate and toward the heat exchanger.

12. The method of claim 9, wherein the heat exchanger is part of a system that includes a set of fans configured to force air to pass between the first plurality of fins such that the air removes the waste heat from the flat surfaces of the first plurality of fins and transfers the waste heat away from the heat exchanger.

13. The method of claim 9, wherein a height of the heat exchanger is less than 44.45 mm.

14. The method of claim 9, wherein a thickness of the flat metal tube less than 2 mm.

15. The method of claim 9, wherein each post of the first plurality of posts comprises a conically-shaped base portion having a bottom surface mounted on the top surface of the metal tube and a cylindrical length portion upon which the first plurality of fins are mounted.

16. A system comprising a heat exchanger, wherein the heat exchanger comprises:
a first section attached to an inlet of the heat exchanger, the first section comprising:
a first flat metal tube having a first flat top surface, a first flat bottom surface, and a first inner passage;
a first upper plurality of solid metal posts mounted perpendicularly upon the first top surface; and
a first lower plurality of solid metal posts mounted perpendicularly upon the first bottom surface;
a second section attached to an outlet of the heat exchanger, the second section comprising:
a second flat metal tube having a second flat top surface, a second flat bottom surface, and a second inner passage;
a second upper plurality of solid metal posts mounted perpendicularly upon the second top surface; and
a second lower plurality of solid metal posts mounted perpendicularly upon the second bottom surface;
an upper plurality of flat metal fins, each fin of the upper plurality of fins mounted on the first upper plurality of posts and the second upper plurality of posts such that the upper plurality of fins are in vertically-spaced, parallel alignment relative to each other, the first top surface, and the second top surface; and
a lower plurality of flat metal fins, each fin of the lower plurality of fins mounted on the first lower plurality of posts and the second lower plurality of posts such that the lower plurality of fins are in vertically-spaced, parallel alignment relative to each other, the first bottom surface, and the second bottom surface,
wherein the heat exchanger is configured to allow a liquid to pass from the inlet heat exchanger and toward the outlet of the heat exchanger via the first inner passage and the second inner passage in series.

17. The system of claim 16, wherein the heat exchanger further comprises:
an intermediate section disposed in the heat exchanger between the first section and the second section, the intermediate section comprising:
a third flat metal tube having a third flat top surface, a third flat bottom surface, and a third inner passage;
a third upper plurality of solid metal posts mounted perpendicularly upon the third top surface; and
a third lower plurality of solid metal posts mounted perpendicularly upon the third bottom surface,
wherein each fin of the upper plurality of fins is further mounted on the third upper plurality of posts,
wherein each fin of the lower plurality of fins is further mounted on the third lower plurality of posts, and
wherein the heat exchanger is further configured to allow the liquid to pass from the inlet heat exchanger and toward the outlet of the heat exchanger via the third inner passage disposed in series between the first inner passage and the second inner passage.

* * * * *